(12) United States Patent
Dinteman (10) Patent No.: US 6,392,866 B1
(45) Date of Patent: May 21, 2002

(54) HIGH FREQUENCY RELAY ASSEMBLY FOR AUTOMATIC TEST EQUIPMENT

(75) Inventor: Bryan J. Dinteman, Canby, OR (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/551,254

(22) Filed: Apr. 18, 2000

(51) Int. Cl.⁷ .................................................. H01H 9/00
(52) U.S. Cl. ...................... 361/206; 361/160; 324/755; 324/763
(58) Field of Search ................................ 324/537, 555, 324/605–607, 158 T, 755, 759–763, 765; 361/160, 166, 191, 206, 210

(56) References Cited

U.S. PATENT DOCUMENTS

| | | | |
|---|---|---|---|
| 4,019,166 A | * 4/1977 | Lawrence et al. | 335/172 |
| 5,572,176 A | * 11/1996 | Heinzl et al. | 335/129 |
| 5,880,540 A | * 3/1999 | Bessho et al. | 324/765 |
| 6,157,200 A | * 12/2000 | Okayasu | 324/753 |
| 6,160,411 A | * 12/2000 | Eliashberg et al. | 324/760 |

* cited by examiner

*Primary Examiner*—Ronald W. Leja
(74) *Attorney, Agent, or Firm*—Daniel J. Bedell; Smith-Hill and Bedell (57) ABSTRACT

A low-profile, short signal path relay assembly implementing several relays for use in an integrated circuit tester, a digitizer or other equipment requiring multiple relays, includes a chassis and a signal board mounted within the chassis. Each relay includes a control rod slideably mounted within the chassis above the signal board, a resilient contact arm mounted on the signal board below the control arm, and a coil assembly mounted adjacent to a magnetic end of the control rod. A spring is positioned between the control rod and the chassis so that it normally forces the control rod to slide in a direction away from the coil assembly. However when a current is applied to the coil assembly it produces a magnetic flux attracting the magnetic end of the control rod toward the coil assembly. As it moves toward the coil assembly, the control rod presses down on the relay's contact arm causing it to contact a pad on the surface of the signal board, thereby creating a signal path through the relay arm between two points on the signal board. When the coil current is turned off, the spring pushes the control rod away from the coil assembly so that it no longer presses on the relay arm. The relay arm thereupon breaks its contact with the pad.

19 Claims, 5 Drawing Sheets

HIGH FREQUENCY RELAY ASSEMBLY FOR AUTOMATIC TEST EQUIPMENT

BACKGROUND OF THE INVENTION

1. Field of the Invention

The present invention relates in general to electrical signal relays and in particular to a relay assembly having a low profile and a short signal path for use in routing high frequency signals to automated test equipment.

2. Description of Related Art

The present invention relates to a low-profile relay assembly suitable for use in switching high frequency signals in automated testing and other applications. For example the relay assembly may be used to switch between various inputs of a high-frequency digitizer or to connect various channels of an integrated circuit tester to input/output terminals of a high-frequency integrated circuit device under test (DUT). In high-frequency test applications, we want to position the test circuit that communicates with the DUT as close as possible to the DUT to minimize the distance signals must travel between the DUT and the test circuits. Short signal paths help to minimize time delays and signal distortion. Since a relay occupies space, we increase the signal path distance between a test circuit and a DUT when we insert a relay in that path. Thus we would like to make a relay as short as possible in the direction of signal flow though the relay.

A typical integrated circuit tester includes a separate digital tester channel connected to each terminal of a DUT, with each channel either transmitting a test signal to the DUT terminal or receiving a test signal from the DUT terminal. An IC tester may also include one or more parametric test units (PMUs) for conducting analog tests on various terminals of a DUT. Thus the IC tester must be able to switch the DUT terminal between its digital test channel and a PMU. High frequency IC testers typically use relays rather than transistor switches to perform this switching function because relays do not distort signals as much as transistor switches. Transmission lines that connect transistor and relay switches include stubs that cause further signal distortion, and transistor switches also exhibit leakage and other undesirable signal path characteristics that compromise test accuracy. Since a tester may need hundreds of channels to test a large DUT, since we want to position each channel's digital drivers and receivers as close as possible to the DUT, and since we have to place relays between those drivers and receivers and the DUT, we would like to be able to pack a large number of relays into a relatively small space near the DUT. Thus in this IC tester application, we not only want to use relays having relatively short signal paths, we also want to use relays that don't require very much space in directions perpendicular to those signal paths so that we can pack a large number of them into a relatively small three-dimensional space.

A typical magnetic reed relay employed in integrated circuit tester applications because of its small size includes a coil of wire surrounding a pair of contact fingers. When a current passes through the coil, it produces a magnetic flux that moves the contact fingers together or apart to make or break the relay contact. In order to produce a sufficiently large magnetic flux without requiring a large current the coil must have many turns. This multiple-turn coil adds width to a coil and makes it difficult to pack a large number of coils into a small area.

SUMMARY OF THE INVENTION

A relay assembly in accordance with the invention implementing a set of relays includes a chassis and a signal board mounted within the chassis. Each relay includes a control rod slideably mounted within the chassis above the signal board, a resilient contact arm mounted on the signal board below the control arm, and a coil assembly mounted adjacent to a magnetic end of the control rod. A separate spring is positioned between each control rod and the chassis so that it normally forces the control rod to slide in a direction away from the coil assembly. However when a current is applied to the coil assembly it produces a magnetic flux attracting the magnetic end of the control rod toward the coil assembly. As it moves toward the coil assembly, the control rod presses down on the relay's contact arm causing it to contact a pad on the surface of the signal board, thereby creating a signal path through the relay arm between two points on the signal board. When the coil current is turned off, the spring pushes the control rod away from the coil assembly so that it no longer presses on the relay arm. The relay arm thereupon breaks its contact with the pad.

In accordance with another aspect of the invention conductors on the signal board route signals from the relay contacts to the circuits that transmit and receive signals through the relay contact arms.

In accordance with a further aspect of the invention, integrated circuits that transmit and receive signals via the relay contact arms are mounted on the signal board proximate to the contacts so as to minimize signal path distance.

It is an object of the invention to provide a relay assembly that concentrates many relays into a small volume.

It is another object of the invention to provide a relay assembly providing relays with very short signal paths through their contacts.

It is a further object of the invention to provide a relay assembly providing relay contacts that can be positioned very close to devices that communicate via the relays.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENT(S)

Figures 1, 2:
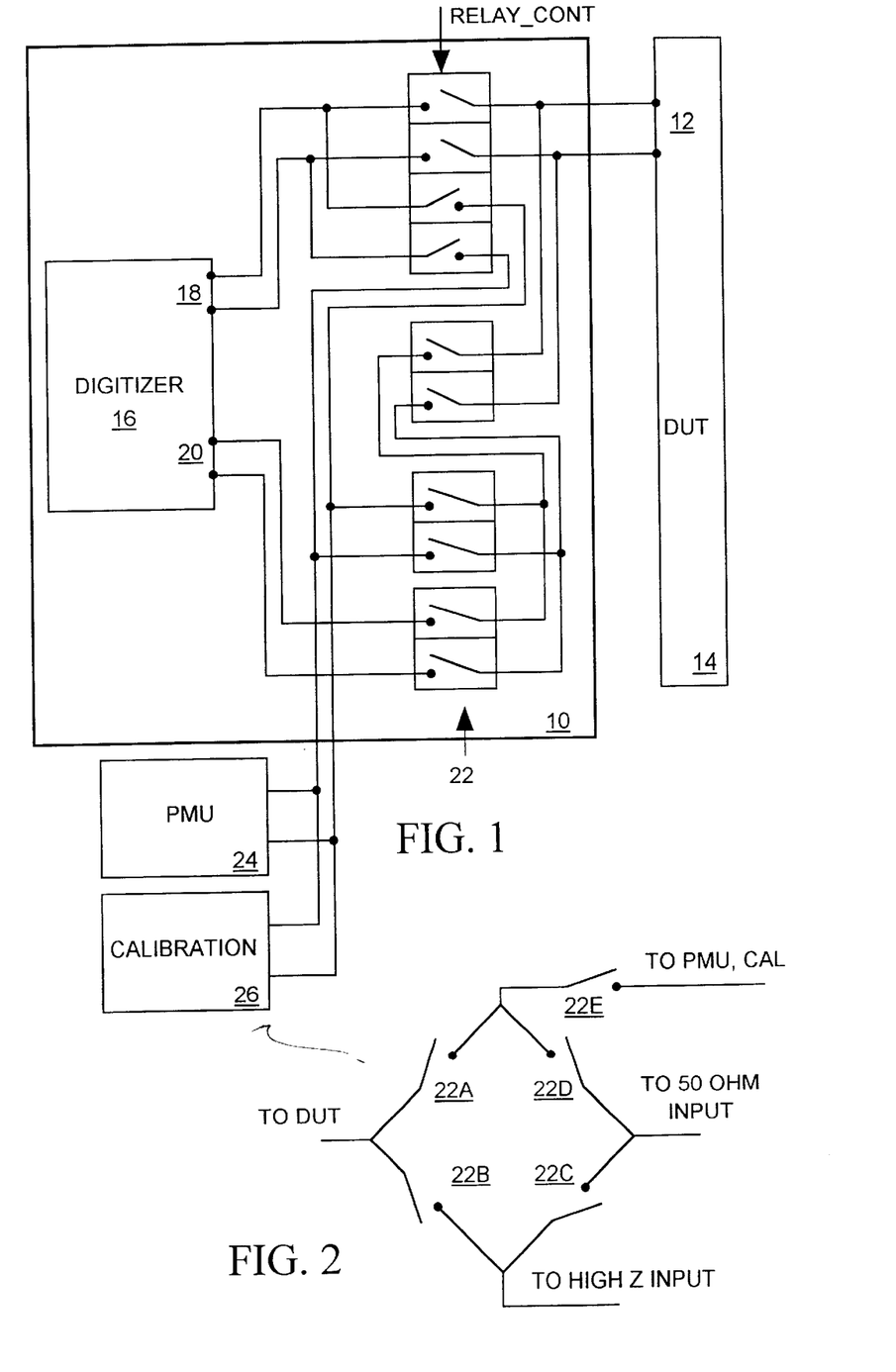
FIG. 1 illustrates a digitizer assembly for digitizing a high frequency differential signal produced at a terminal of an integrated circuit device under test (DUT)
FIG. 2 is a simplified schematic diagram illustrating how relays of FIG. 1 interconnect various devices.

FIG. 1 illustrates a digitizer assembly 10 for digitizing a high frequency differential signal produced at a terminal 12 of an integrated circuit device under test (DUT) 14. Digitizer assembly 10 includes a conventional digitizer 16 for digitizing an input signal that may be supplied to either a 50 ohm input 18 or a high impedance ("high") input 20. Digitizer assembly 10 includes a set of relays 22 in accordance with the invention for selectively routing the DUT output signal to either one of the digitizers two inputs 18, 20. Relays 22, controlled by an externally generated relay control signal (RELAY_CONT), may alternatively link DUT terminal 12 or either digitizer input 18 or 20 to an external circuit such as a conventional parametric measurement unit (PMU) 24 or a calibration circuit 26.

FIG. 2 is a simplified schematic diagram illustrating how relays 22 interconnect DUT terminals 12, digitizer inputs 18 and 20, PMU 24 and calibration circuit 26. Although the signals being routed in FIG. 1 are differential signals requiring two-line differential signal paths, for simplicity, FIG. 2 shows only single-line signal paths requiring five relays 22A–22E instead of two-line signal paths requiring ten relays as seen in FIG. 1.

In high frequency test applications, we want to position digitizer 16 as close as possible to DUT terminal 12 to minimize the distance the DUT output signal must travel to the digitizer because short signal paths minimize signal distortion. Since relays 22 occupy space, we implement them using a relay assembly in accordance with the invention having a short signal path in the direction of signal flow through the relays contacts. To further minimize signal path distances we provide a relay assembly in which relays 22 are densely packed near DUT terminal 12. The relay assembly also provides a constant transmission line impedance throughout the signal path to further minimize signal distortion while maximizing frequency response. The relay assembly also only minimally influences transmission line characteristics when in the open state.

Relay Assembly

Figure 3:
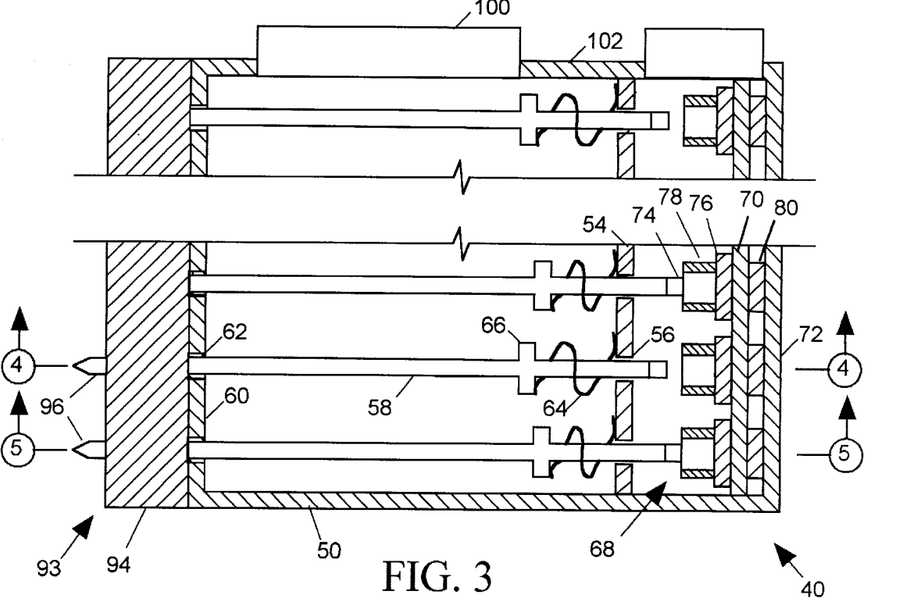
FIG. 3 is a plan view of a relay assembly in accordance with the invention.
Figure 4:
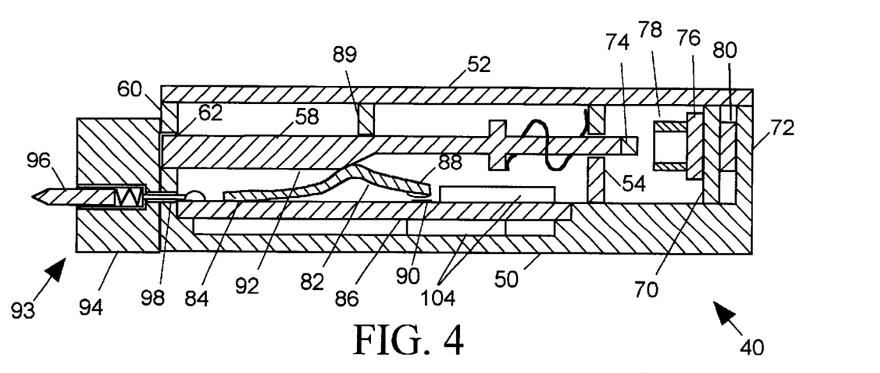
FIGS. 4 and 5 are sectional elevation views of the relay assembly of FIG. 3.
Figure 5:
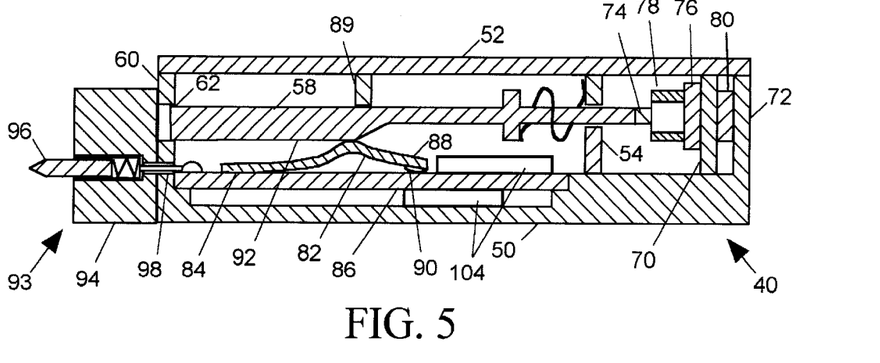

FIG. 3 is a simplified plan view, and FIGS. 4 and 5 are sectional elevation views of a relay assembly 40 in accordance with the invention for implementing relays 22 of FIG. 1. Relay assembly 40 includes a chassis 50 having a removable cover 52. A support member 54 within chassis 50 includes a set of apertures 56, each for slideably receiving an end of one of a set of ten relay control rods 58. A rear wall 60 of chassis 50 includes another set of apertures 62 for slideably receiving opposite ends of control rods 58. A coil spring 64 extending between support member 54 and a stub 66 of each control rod 58 normally forces the control rod backward, deep into the aperture 62, as seen in FIG. 4. Relay assembly 40 also includes a set of coil assemblies 68 mounted on a printed circuit board ("coil board") 70 extending along a front wall 72 of chassis 50. Each coil assembly 68, mounted proximate to a magnetic end 74 of a separate one of control rods 58, includes a relay coil 76 mounted on one side of a circuit board 70, a ferrite disk 80 mounted on the other side of coil board 70 adjacent to coil 76, and a ferrite tube 78 attached to coil 76.

A resilient, conductive relay arm 82 residing under each control rod 58 includes a base end 84 attached to a printed circuit board ("signal board") 86 mounted on chassis 50. A contact end 88 of relay arm 82 resides above a conductive pad 90 on a upper surface of signal board 86. When a current passes through coil 76, it induces magnetic flux in ferrite tube 78 causing it to attract the magnetic end 74 of the adjacent control rod 58. The attraction force is sufficiently large to overcome the opposing force of spring 64 on control rod 58 so that the control rod 58 moves forward toward coil assembly 68 as seen in FIG. 5. As it does so, a stub 92 on the underside of control rod 58 contacts relay arm 82 forcing its contact end 88 onto pad 90, thereby providing a signal path through relay arm 82 between traces (not shown) on the surface of signal board 86 connected to pad 90 and the base end 84 of relay arm 82. A thrust block 89 mounted on the under surface of cover 52 prevents control rod 58 from flexing upward as it presses against relay arm 82. When coil 76 is de-energized, spring 64 again pushes control rod rearward toward rear wall 60 permitting relay arm 82 contact end 88 to rise up, thereby breaking its contact with pad 90 as seen in FIG. 4.

As control rod 58 forces contact end 88 onto pad 90, it also pushes contact end 88 slightly forward against pad 90 thereby producing a wiping action that helps prevent residue build-up on contact end 88 and pad 90. A similar wiping action occurs whenever control rod 58 allows contact end to rise off pad 90. Contact end 88 and pad 80 are preferably coated with gold or other inert conductive material.

A pogo pin assembly 93 mounted outside the rear end 60 of chassis 50 includes an assembly housing 94 holding a pair of pogo pin connectors 96. Conductive leads 98 extending though the rear wall 60 of relay assembly chassis 50 link each pogo pin connector 96 to traces (not shown) on a surface of signal board 86 which further link the pogo pins 96 to the base ends 84 of two of relay arms 82. Pogo pins 96, which may contact the DUT terminals, are positioned to minimize the signal path distance between each pogo pin 96 and the base end 84 of the relay arm 82 to which it is linked.

Other traces on the surface of signal board 86 provide signal routing between base ends 84 of various relay arms 82 not linked to a pogo pin 96, various contact pads 90 and a connector 100 mounted on an end 102 of chassis 50. Connector 100 provides signal access to external circuits such as digitizer 16, PMU 24 or calibration circuit 26 of FIG. 1. Optionally one or more integrated circuits 104, for example, implementing digitizer 16, may be mounted on the upper or lower surface of signal board 86 proximate to relay arms 82 so as to substantially minimize signal path distances. In such case, circuit board vias and traces on signal board 86 route signals between terminals of ICs 104, contact pads 90, base ends 84 of relay arms 82 and connector 100. Signal board 86 is a conventional circuit board and is suitably configured to provide signal traces having a constant transmission-line impedance, suitably 50 Ohms.

Double Break Contact Assembly

In the relay assembly 40 of FIGS. 3–5 relay arm 82 is relatively close to ground planes and other conductors in signal board 86, and can therefore can add a small amount of capacitance to the signal paths linked to its base end 84 that can distort signals traveling on those signal paths to an extent that may not be tolerable in some high frequency applications. Accordingly an alternative embodiment of the invention lifts both ends of the relay arm from the circuit board so that no portion of the relay arm remains in contact with a signal path when the relay contacts are open.

Figure 6:
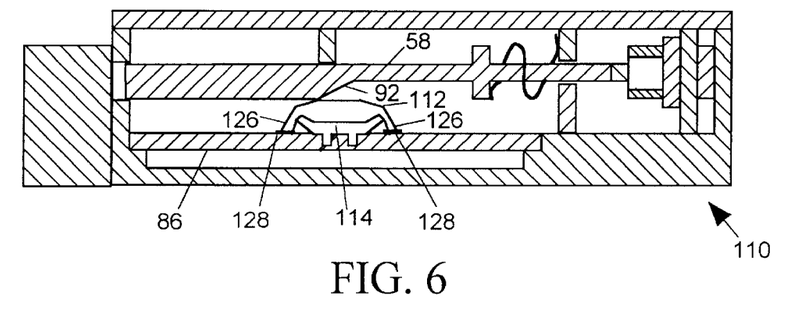
FIGS. 6 and 7 are sectional elevation views of alternative embodiment of a relay assembly in accordance with the invention.
Figure 7:
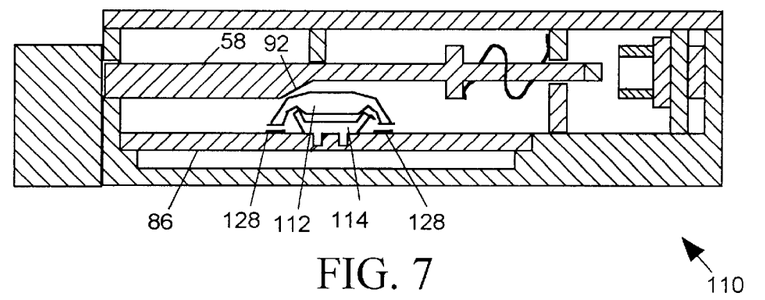
Figure 8:
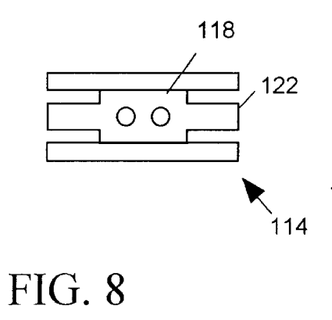
FIGS. 8, 9 and 10 are, respectively, plan, side and end elevation view of a cradle assembly of the relay assembly of FIGS. 6 and 7.
Figure 9:
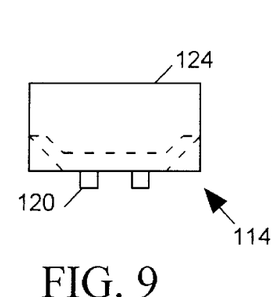
Figure 10:
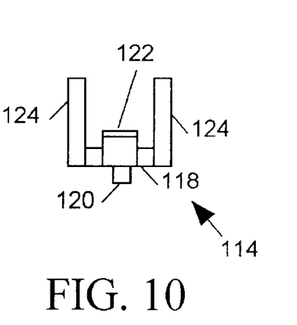

FIGS. 6 and 7 are sectional elevation views of a relay assembly in accordance with the invention which is generally similar to relay assembly 40 of FIGS. 3–5 but employs a modified contact mechanism. Relay assembly 110 includes a conductive contact assembly 112 residing in a non-conductive cradle assembly 114 mounted on the surface of signal board 86. FIGS. 8, 9 and 10 are, respectively, plan, side and end elevation view of cradle assembly 114. Cradle assembly 114 includes a base 118 attached to signal board 86. A pair of guide pins 120 extending into holes on signal board 86 help position base 118 on signal board 86. Base 118 includes a pair of resilient springs 122 upon which contact assembly 112 rests. A pair side plates 124 extend upward from base 118 on either side of contact assembly 112 to hold the contact assembly in place. When control rod 58 moves forward as illustrated in FIG. 6, control rod stub 92 presses contact assembly 112 downward and a pair of contact arms 126 on contact assembly 112 contact an adjacent pair of contact pads 128 on the surface of signal board 86. The conductive contact assembly 112 thus provides a signal path between the two contact pads 128. When control rod 58 moves rearward as illustrated in FIG. 7, control rod stub 92 allows contact assembly 112 to rise so that contact arms 126 break their contact with contact pads 128 thereby breaking the signal path between the two contact pads 128.

Figure 11:
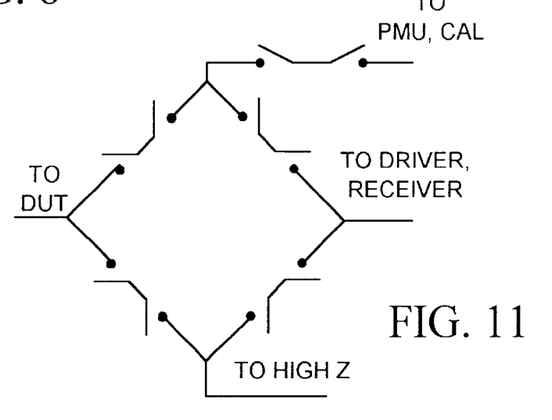
FIG. 11 is a schematic diagram illustrating how the alternative embodiment of the relay assembly shown FIGS. 6 and 7 interconnects various devices of FIG. 1.

FIG. 11 is the schematic equivalent of the circuit of FIG. 2 when the double-break contact assembly 112 of FIGS. 6–10 is employed instead of a single-break contract relay assembly of FIGS. 3–5. Note that no contact arms are linked to a signal path when a relay is open.

Integrated Circuit Tester

Figure 12:
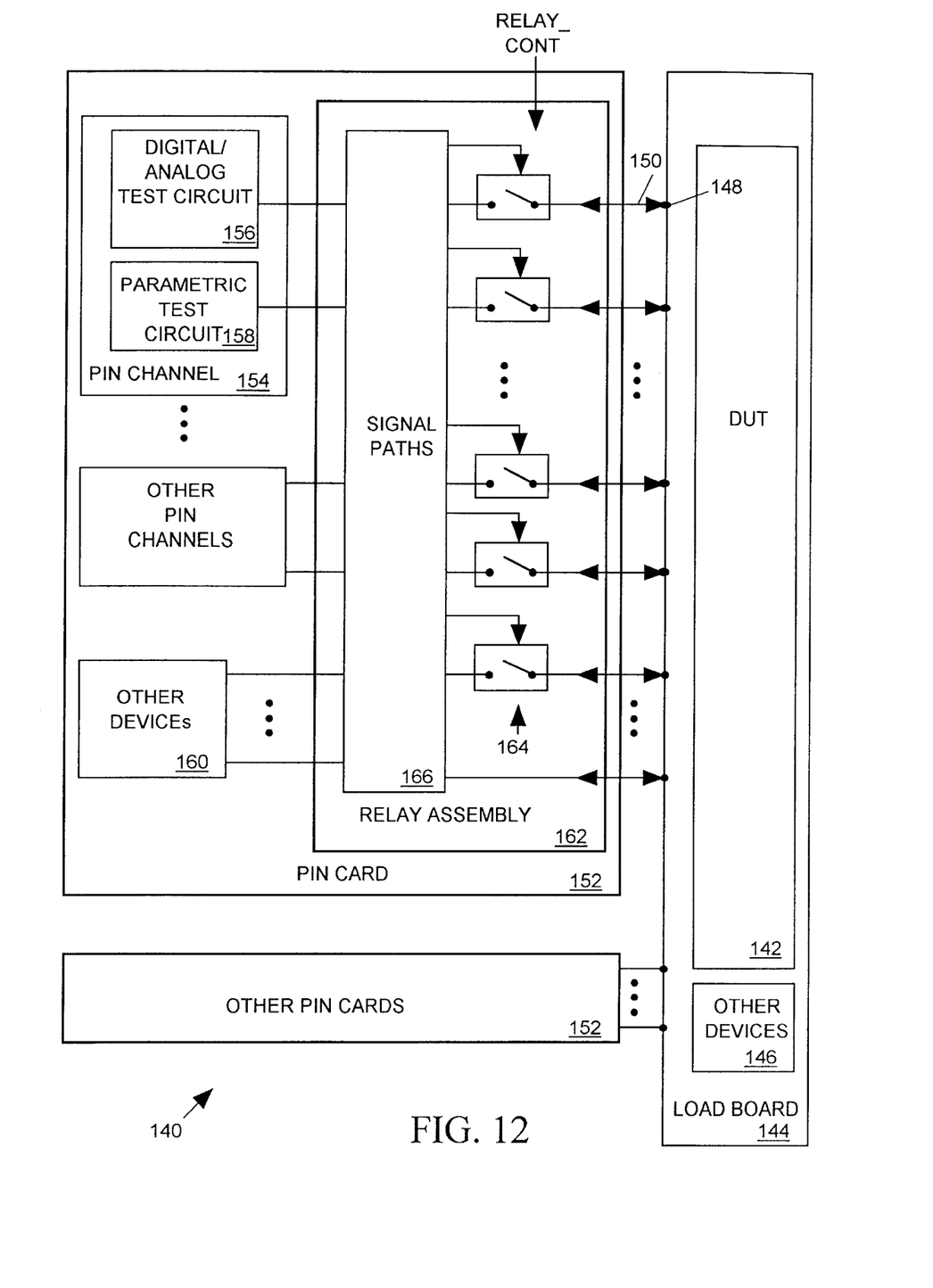
FIG. 12 is a simplified block diagram of a portion of an integrated circuit (IC) tester in accordance with the invention.

FIG. 12 is a simplified block diagram of a portion of an integrated circuit (IC) tester 140 in accordance with the invention for testing an IC device under test (DUT) 142 mounted on a "load board" 144. Load board 144, a circuit board for holding DUT 142 and possibly other test devices 146 that communicate with DUT 142 during a test, includes a set of contact pads 148 accessible via a set of pogo pin connectors 150. Conductive traces (not shown) on load board 144 link contact pads 148 to terminals of DUT 142 and other devices 146. Tester 140 includes a set of "pin cards" 152. Each pin card 152 is a circuit board containing circuits implementing one or more "pin channels" 154. Each pin channel 154 includes a digital/analog test circuit 156 for transmitting a test signal to a terminal of DUT 142 or receiving and processing a DUT output signal during a digital or analog test. Each pin channel 154 may also include a parametric test circuit 158 for carrying out parametric tests on DUT 142 by transmitting and receiving analog test signals to or from DUT 142 during a test. A pin card 152 may also hold other devices 160 for sending signals to or receiving signals from terminals of DUT 142 or the other device 146 mounted on load board 144. Each pin card 152 includes a relay assembly 162 in accordance with the invention for linking the pin channel 154 and other devices 160 to pogo pins 150. Relay assembly 162 includes a set of relay contacts 164 for selectively linking ports of pin channels 154 and possibly some ports of other devices 160 to pogo pins 150 though signal paths 166 implemented within relay assembly 162. Signal paths 166 may also route signals that do not need to be switched by a relay 164 directly between pogo pins 150 and other devices 160, Signal paths 166 also route externally generated relay control signals (RELAY_CONTROL) to control terminals of relays 164.

Test Head

Figures 13, 14, 15:
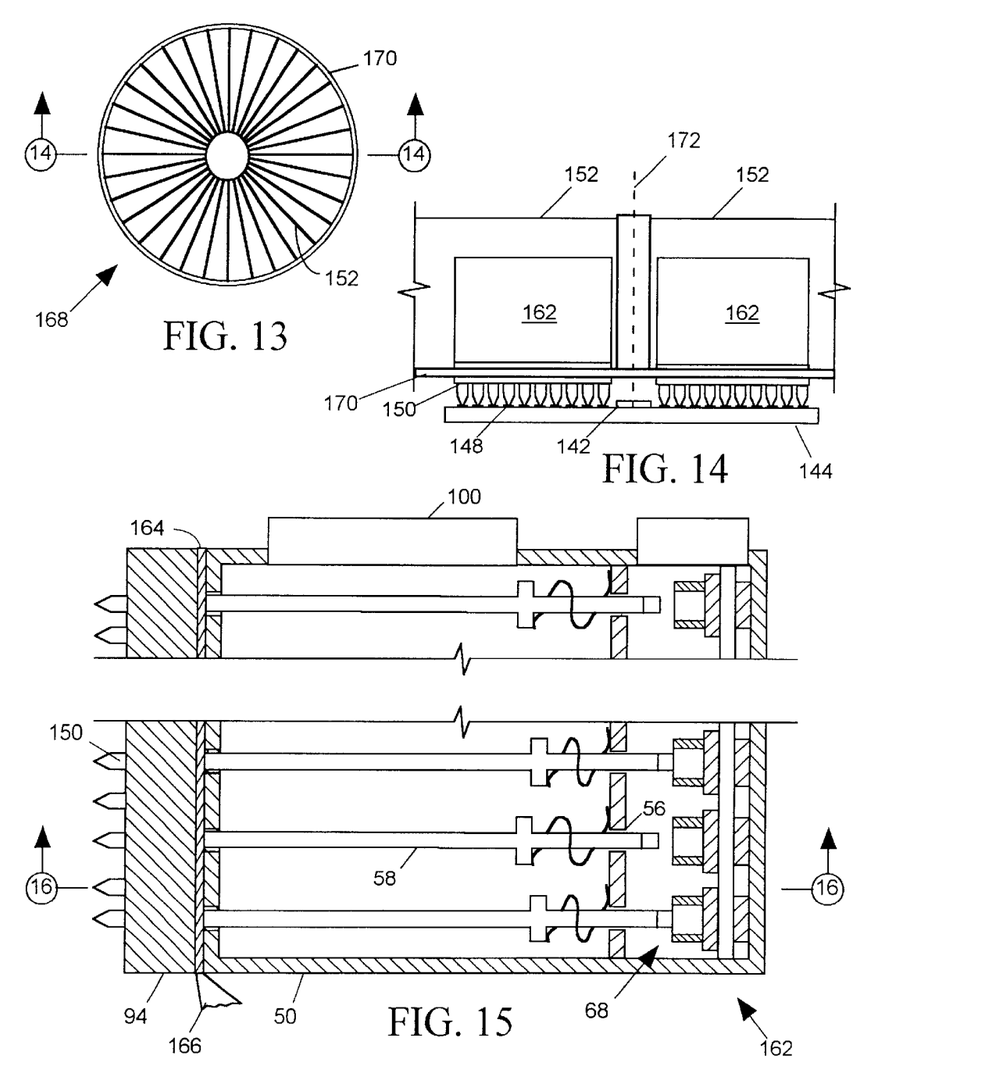
FIGS. 13 and 14 illustrate a simplified plan view and partial sectional elevation view, respectively, of a test head for the IC tester of FIG. 12.
FIGS. 15 and 16 are plan and sectional side elevation views, respectively, of one relay assembly of FIG. 14.

FIGS. 13 and 14 illustrate a simplified plan view and partial sectional elevation view, respectively, of a test head 168 for holding multiple pin cards 152 of FIG. 12. Test head 168 includes a cylindrical chassis 170 for holding a large number of pin cards 152 radially distributed about a vertical axis 172 passing though the DUT 142 mounted load board 144. The relay assembly 162 of each pin card 152 is mounted on a lower corner of the pin card near vertical axis 172 with pogo pins 150 extending downward through slots in test head chassis 170 to contact the pads 148 on the surface of load board 144.

Each relay assembly 162 is mounted as close as possible to vertical axis 172 to minimize the signal path distance between its internal relays and DUT 142. As we can see from FIG. 13, when we increase the number of pin cards 152 in test head 168, the space between pin cards 152 becomes progressively limited near axis 172. To provide a test head having a large number of cards, while keeping each channel's relays within a maximum allowable signal distance from DUT 142, we want to provide a relay assembly 162 that is as thin as possible so that it can fit into the small space between pin cards 152 near axis 172. We also want to minimize the space that relay assembly 162 requires on pin card 152 so that we can mount IC's implementing the pin channel circuits as close as possible to pogo pins 150, thereby minimizing total signal path distances between these circuits and DUT 142.

Pin Card Relay Assembly

Figure 16:
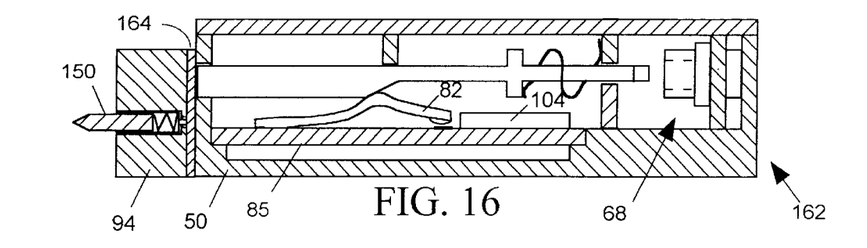

FIGS. 15 and 16 are plan and sectional side elevation views of one relay assembly 162 of FIG. 14. Since relay assembly 162 has many elements in common with relay assembly 40 of FIGS. 3–5, like elements are provided with like reference characters. Referring to FIGS. 14–16, implementing relays 164 of FIG. 12, a relay assembly 162 includes a corresponding control rod 58, a coil assembly 68 and relay arm 82. A pogo pin housing 94 holds the pogo pins 150 that contact load board 148. Some of pogo pins 150 are linked to relay arms 82 via leads (not shown) bonded to traces (not shown) on signal board 86 in the same way that pogo pins 96 of FIG. 5 are linked to relay arms as described above. Other pogo pins 150 conveying signals that are not routed though relay contacts may be connected through leads to traces on signal board 86 leading to external connectors 100 or directly to integrated circuits 104 that may be optionally mounted on signal board 86 within relay assembly 162. As illustrated in FIG. 16, still other pogo pins 150 may be connected to conductors on a flex circuit 164 mounted between the pogo pin housing 94 and chassis 50. An end 166 of flex circuit 164 extends beyond chassis 50 so that its conductors can be bonded to traces on the surface of pin card 152 leading to various devices mounted on the pin card.

Thus has been shown and described, a low-profile, short signal path relay assembly implementing several relays for use in an integrated circuit tester, a digitizer or other equipment requiring multiple relays. The relay assembly permits a large number of relays to be concentrated into a small volume, provides a short signal path through its contacts, and can permit its contacts to be positioned very close to integrated circuits that communicate through those contacts. This minimizes signal path distances, thereby making the relay assembly suitable for switching high frequency signals, particular in integrated circuit test application.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A relay comprising:

a chassis;

a signal board mounted on the chassis and having a surface;

a coil assembly, mounted in the chassis, for producing a magnetic flux when a current is supplied thereto and for ceasing production of said magnetic flux when said current ceases to be supplied thereto;

a control rod mounted within the chassis above the signal board for moving along an axis passing though the coil assembly, the magnetic flux produced by said coil assembly applying a first force on the control rod in a first direction along the axis;

means for applying a second force on the control rod in a second direction along the axis opposite to the first direction; and a conductive contact arm residing between the surface of the signal board and the control rod, wherein the control rod moves in the first direction when the current is supplied to the coil assembly and moves in the second direction when current ceases to be supplied to the coil assembly, and wherein the control rod contacts the contact arm with a pressure that increases when the control rod moves in one of the first and second directions and decreases when the control rod slides in another of the first and second directions.

2. The relay in accordance with claim 1 wherein the contact arm makes a contact with the surface of the signal board when the control rod increases the pressure and breaks the contact with the surface of the signal board when the control rod decreases the pressure.

3. The relay in accordance with claim 1 wherein the means for applying a second force comprises a spring contacting the chassis and the control arm.

4. The relay in accordance with claim 1 wherein the coil assembly comprises:

a coil for conducting the current, and ferrite material attached to the coil.

5. The relay in accordance with claim 1 wherein the conductive contact arm comprises resilient conductive material having a base end attached to the surface of the signal board, and a contact end making said contact with a point on the surface of the signal board when the control rod increases the pressure and breaking said contact with the point on the surface of the signal board when the control rod decreases the pressure.

6. The relay in accordance with claim 5 wherein the signal board comprises a printed circuit board and wherein printed circuit board includes conductors connected to the base end and to the point on the surface of the signal board.

7. The relay in accordance with claim 1 wherein the conductive contact arm comprises resilient conductive material having two contact ends for making contact with points on the surface of the signal board when the control rod increases the pressure and breaking said contact with the points on the surface of the signal board when the control rod decreases the pressure.

8. The relay in accordance with claim 7 wherein the signal board comprises a printed circuit board and wherein printed circuit board includes conductors connected to said points on the surface of the signal board.

9. The relay in accordance with claim 7 wherein the relay further comprises a resilient cradle assembly (114) mounted on the surface of the signal board for holding said contact arm and for moving said contact arm in a direction away from said surface of said signal board when said control arm reduces the pressure on said contact arm.

10. A relay assembly implementing a plurality of relays, the assembly comprising:

a chassis;

a signal board mounted on the chassis and having a surface;

a plurality of coil assemblies mounted on the chassis, each corresponding to separate one of said relays, for producing a magnetic flux when a current is supplied thereto and for ceasing production of said magnetic flux when said current ceases to be supplied thereto;

a plurality of control rods, each corresponding to a separate one of said coil assemblies and mounted within the chassis for moving along a separate axis passing though the corresponding coil assembly, the magnetic flux produced by each said coil assembly applying a first force on its corresponding control rod in a first direction along said axis;

means for applying a second force on each control rod in a second direction along its axis in which it moves opposite to the first direction; and a plurality of conductive contact arms, each corresponding to a separate control rod and residing between the surface of the signal board and the corresponding control rod, wherein each the control rod moves in the first direction along its axis when a current is supplied to its corresponding coil assembly and moves in the second direction along its axis when the current ceases to be supplied to its corresponding coil assembly, and wherein each control rod contacts its corresponding contact arm with a pressure that increases when the control rod moves in one of the first and second directions along its axis and decreases when the control rod slides in another of the first and second directions along its axis.

11. The relay in accordance with claim 10 wherein each contact arm makes a contact with the surface of the signal board when its corresponding control rod increases its pressure on the contact arm and breaks the contact with the surface of the signal board when its corresponding control rod decreases its pressure on the contact arm.

12. The relay in accordance with claim 10 wherein the means for applying a second force comprises a separate spring corresponding to each control rod contacting the chassis and its corresponding control arm.

13. A digitizer assembly for selectively contacting a terminal of a device under test (DUT) and for digitizing an output signal produced by the DUT at said terminal, the digitizer assembly comprises, a digitizer circuit for having an input for digitizing a signal supplied to said input;

a chassis;

a signal board mounted on the chassis and having a surface;

a coil assembly, mounted in the chassis, for producing a magnetic flux when a current is supplied thereto and for ceasing production of said magnetic flux when said current ceases to be supplied thereto;

a control rod mounted within the chassis above the signal board for moving along an axis passing though the coil assembly, the magnetic flux produced by said coil assembly applying a first force on the control rod in a first direction along the axis;

means for applying a second force on the control rod in a second direction along the axis opposite to the first direction;

a conductive contact arm residing between the surface of the signal board and the control rod, wherein the control rod moves in the first direction when the current is supplied to the coil assembly and moves in the second direction when current ceases to be supplied to the coil assembly, wherein the control rod contacts the contact arm with a pressure that increases when the control rod moves in one of the first and second directions and decreases when the control rod slides in another of the first and second directions, and wherein the contact arm makes a contact with the surface of the signal board when the control rod increases the pressure and breaks the contact with the surface of the signal board when the control rod decreases the pressure; and conductive means for linking said terminal of said DUT to said surface of said signal board and for linking said input of said digitizer to said surface of said signal board, such that when said contact arm makes said contact with said surface of said signal board, said conductive means and said contact arm create a signal path between said terminal of said DUT and said input of said digitizer circuit.

14. The digitizer assembly in accordance with claim 13 wherein said signal board comprises a printed circuit board and said conductive means comprises traces on said printed circuit board.

15. The digitizer assembly in accordance with claim 14 wherein at least a portion of said digitizer circuit is mounted on said signal board.

16. An integrated circuit (IC) tester for testing an IC device under test (DUT) having terminals conductively linked to a set of contact pads, the IC tester testing the DUT by transmitting test signals to its terminals and processing response signals the IC produces at its terminals, the IC tester comprising:

a tester circuit for producing said test signals and for receiving and processing said response signals;

a chassis;

a signal board mounted on the chassis and having a surface;

a plurality of coil assemblies mounted on the chassis, each producing a magnetic flux when a current is supplied thereto and ceasing production of said magnetic flux when said current ceases to be supplied thereto;

a plurality of control rods, each corresponding to a separate one of said coil assemblies and mounted within the chassis for moving along an axis passing though the corresponding coil assembly, the magnetic flux produced by the corresponding coil assembly applying a first force on the corresponding control rod in a first direction along said axis;

means for applying a second force on each control rod in a second direction along the axis in which it moves opposite to the first direction;

a plurality of conductive contact arms, each corresponding to a separate control rod and residing between the surface of the signal board and the corresponding control rod, wherein each control rod moves in the first direction along its axis when a current is supplied to its corresponding coil assembly and moves in the second direction along its axis when the current ceases to be supplied to its corresponding coil assembly, wherein each control rod contacts its corresponding contact arm with a pressure that when the control rod moves in one of the first and second directions along its axis and decreases when the control rod slides in another of the first and second directions along its axis, and wherein each contact arm makes a contact with the surface of the signal board when its corresponding control rod increases its pressure on the contact arm and breaks the contact with the surface of the signal board when its corresponding control rod decreases its pressure on the contact arm; and means for conductively linking said contact pads and said tester circuit to said signal board, such that when any one of said contact arms makes contact with said surface of said signal board, that one of said contact arms forms a part of a signal path between one of said contact pads and said tester circuit.

17. The IC tester in accordance with claim 16 wherein the means for applying a second force comprises a separate spring corresponding to each control rod contacting the chassis and its corresponding control arm.

18. The IC tester in accordance with claim 16 wherein said means for conductively linking comprises a pogo pin for contacting one of said contact pads, and means for conductively linking said pogo pin to said surface of said signal board.

19. The IC tester in accordance with claim 16 wherein said tester circuit comprises drivers for producing said test signals and receivers for receiving said response signals, and wherein said drivers and receivers are mounted on said signal board.

* * * * *